United States Patent
Wang et al.

(10) Patent No.: US 7,561,320 B2
(45) Date of Patent: Jul. 14, 2009

(54) MODULATION OF ELECTROMAGNETIC RADIATION WITH ELECTRICALLY CONTROLLABLE COMPOSITE MATERIAL

(75) Inventors: Shih-Yuan Wang, Palo Alto, CA (US); Alexandre Bratkovski, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/977,886

(22) Filed: Oct. 26, 2007

(65) Prior Publication Data
US 2009/0109516 A1 Apr. 30, 2009

(51) Int. Cl.
G02F 1/01 (2006.01)
G02F 1/03 (2006.01)

(52) U.S. Cl. ........................ 359/238; 359/245
(58) Field of Classification Search ............... 359/238, 359/245
See application file for complete search history.

(56) References Cited
U.S. PATENT DOCUMENTS

| | | | |
|---|---|---|---|
| 6,946,702 B2 | 9/2005 | Jang | |
| 7,224,598 B2 | 5/2007 | Perner | |
| 7,420,445 B2 | 9/2008 | Wyeth et al. | |
| 2005/0185118 A1* | 8/2005 | Murade | 349/111 |
| 2007/0008785 A1 | 1/2007 | Scheuerlein | |
| 2007/0215843 A1 | 9/2007 | Soukoulis et al. | |

* cited by examiner

Primary Examiner—Jordan M. Schwartz
Assistant Examiner—James C Jones

(57) ABSTRACT

An apparatus and related methods for modulating an electromagnetic radiation beam are described. A composite material is positioned in the path of the radiation beam, the composite material comprising a plurality of commonly oriented metallic first lines spaced apart by less than a wavelength of the radiation beam and a plurality of commonly oriented metallic second lines also spaced apart by less than that wavelength. The second lines are positioned in a crossing arrangement with the first lines, a crosspoint location being defined where each first line crosses each second line. An electrically programmable impedance memory element is positioned at each crosspoint location and is electrically coupled between the first and second lines corresponding to that crosspoint location, each impedance memory element having an electrically programmed state. The composite material modulates the radiation beam according to the electrically programmed states of the impedance memory elements.

20 Claims, 3 Drawing Sheets

MODULATION OF ELECTROMAGNETIC RADIATION WITH ELECTRICALLY CONTROLLABLE COMPOSITE MATERIAL

FIELD

This patent specification relates generally to the modulation of propagating electromagnetic radiation, such as electromagnetic radiation in at least one of the visible, infrared, and microwave frequency ranges, for any of a variety of useful purposes.

BACKGROUND

Devices for modulating the propagation of electromagnetic radiation represent fundamental building blocks for many modern technologies. Where a single spatial dimension is involved, such as in the propagation of an optical signal down an optical fiber, such modulation is commonly achieved by devices affecting the amplitude of the propagating light (e.g., OFF/ON). In that environment, one-dimensional electrooptical modulators are often used that are based on electrooptic and/or magnetooptic materials such as calcite, quartz, and lithium niobate that change their refractive index responsive to applied control signals, the materials being arranged into Mach-Zehnder interferometers (MZIs) or similar devices converting induced phase changes into amplitude changes by interference effects. Other one-dimensional electrooptical modulators include electroabsorption modulators variably absorbing the incident signal according to an applied electric field, and acoustic wave modulators using high-frequency sound traveling within a crystal or a planar wave guide to deflect light from one place to another.

Where two spatial dimensions are involved, e.g., in the controlled propagation of optical wavefronts in imaging systems, devices for temporal control of the propagating radiation include liquid crystal-based spatial light modulators (SLMs) and microelectromechanical (MEMs)-based SLMs, each generally providing for pixelwise amplitude or phase modulation of the propagating radiation. For static cases (i.e., no temporal control), incident optical wavefronts can be modulated by interferometrically recorded holograms of various kinds, including amplitude holograms recorded onto high-resolution photographic emulsions and phase holograms recorded onto photoresists or dichromated gelatins.

For any particular radiation modulation scheme, fundamental issues often arise with regard to one or more of spatial resolution, modulation depth, modulation speed, scalability to different wavelength regimes, amenability to computer control, and independence between amplitude and phase control. Moreover, practical issues often arise with regard to one or more of materials cost, materials availability, fabrication cost, durability, drive circuitry requirements, power consumption, device size, heat dissipation, and noise performance. Other issues arise as would be apparent to one skilled in the art in view of the present disclosure.

SUMMARY

In accordance with an embodiment, an apparatus is provided, comprising a source of a radiation beam having a wavelength, and a composite material. The composite material comprises a plurality of commonly oriented metallic first lines spaced apart by less than the wavelength of the radiation beam, and further comprises a plurality of commonly oriented metallic second lines spaced apart by less than that wavelength. The second lines are positioned in a crossing arrangement with the first lines, a crosspoint location being defined where each of the first lines crosses each of the second lines. An electrically programmable impedance memory element is positioned at each of the crosspoint locations and is electrically coupled between the first and second lines corresponding to that crosspoint location, each impedance memory element having an electrically programmed state. The composite material modulates the radiation beam according to the electrically programmed states of the impedance memory elements.

Also provided is a method for modulating a radiation beam, comprising causing the radiation beam to impinge upon a composite material, the composite material comprising a plurality of commonly oriented metallic first lines having a first average spacing less than a wavelength of the radiation beam and a plurality of commonly oriented metallic second lines having a second average spacing less than that wavelength. The second lines are positioned in a crossing arrangement with the first lines, a crosspoint location being defined where each of the first lines crosses each of the second lines, and an electrically programmable impedance memory element is positioned at each crosspoint location and electrically coupled between the first and second lines corresponding to that crosspoint location. The method further comprises programming each of the impedance memory elements by applying an electrical programming signal across the first and second lines corresponding to that impedance memory element, thereby placing that impedance memory element in a programmed state. The radiation beam is modulated by the composite material according to the programmed states of the impedance memory elements.

Also provided is an apparatus, comprising a source of a radiation beam having a wavelength and a substrate that is substantially non-attenuating at that wavelength. The apparatus further comprises a cross-point array formed on the substrate, the cross-point array comprising a layer of substantially parallel metallic row conductors disposed in a crossing pattern with a layer of substantially parallel metallic column conductors. The row conductors and the column conductors each have average spacings less than the wavelength of the radiation beam. The cross-point array further comprises an electrically programmable impedance memory element at each cross-point between the row and column conductors. The apparatus further comprises an electrical programming circuit coupled to the cross-point array for transferring a desired pattern of programmed states to the impedance memory elements. The radiation beam is modulated according to electrically programmed states of the impedance memory elements while propagating through the cross-point array.

DETAILED DESCRIPTION

Figure 1:
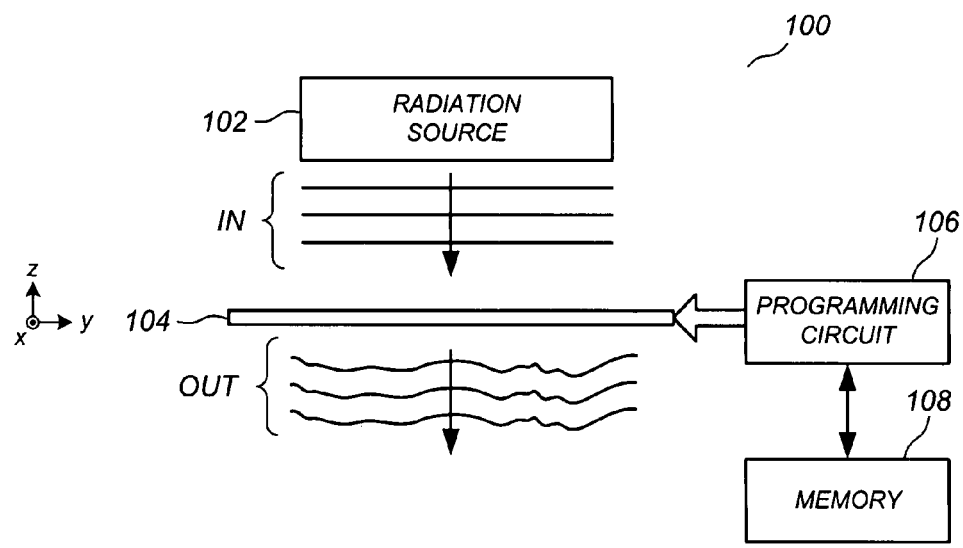
FIG. 1 illustrates a side view of an apparatus for modulating electromagnetic radiation according to an embodiment.

FIG. 1 illustrates an apparatus 100 for modulating electromagnetic radiation according to an embodiment. Apparatus 100 comprises a source 102 of an incident radiation beam IN that impinges upon a composite material 104. Although illustrated in the example of FIG. 1 as impinging upon the composite material 104 at a normal angle of incidence, it is to be appreciated that the incident radiation beam IN can impinge at one or more non-normal angles of incidence without departing from the scope of the present teachings. The incident radiation beam IN is modulated by the composite material 104 as it propagates therethrough to result in a modulated radiation beam OUT. Apparatus 100 further comprises a programming circuit 106 and a memory 108, the programming circuit 106 being operably coupled between the composite material 104 and the memory 108. In one embodiment, the composite material 104 is programmed by operation of the programming circuit 106 according to a desired set of states stored in the memory 108, as discussed further infra, and modulates the incident radiation beam IN according to its programmed state. The wavelength at which the radiation beam IN is modulated by the composite material 104 according to the desired programmed state is referenced herein as the operating wavelength.

Without limitation, the modulation that can be provided by the composite material 104 in accordance with one or more of the embodiments includes static spatial modulation, dynamic spatial (spatiotemporal) modulation, and temporal-only modulation. As used herein, modulation refers to the variation of a property in an electromagnetic wavefront or signal, such as amplitude, frequency, phase, spectral content, or other measurable characteristic. As used herein, spatial modulation refers to spatially-dependent variation in such property or measurable characteristic, such as when one location on a surface receiving a radiation beam causes a different amplitude and/or phase variation in the radiation beam than a different location on that surface. As used herein, static spatial modulation refers to spatial modulation that remains fixed in time, while dynamic spatial (spatiotemporal) modulation refers to spatial modulation that varies with time for at least one location. Finally, temporal-only modulation refers to variation of the amplitude, frequency, phase, spectral content, or other measurable characteristic of the electromagnetic wavefront or signal over time, but not over space. One example of temporal-only modulation that can be provided by the composite material 104 is radiation gating, wherein the incoming radiation is passed through with minimal change for an ON state, or is inhibited from passing through for an OFF state, with all locations across the surface of the composite material 104 operating identically.

Figure 2:
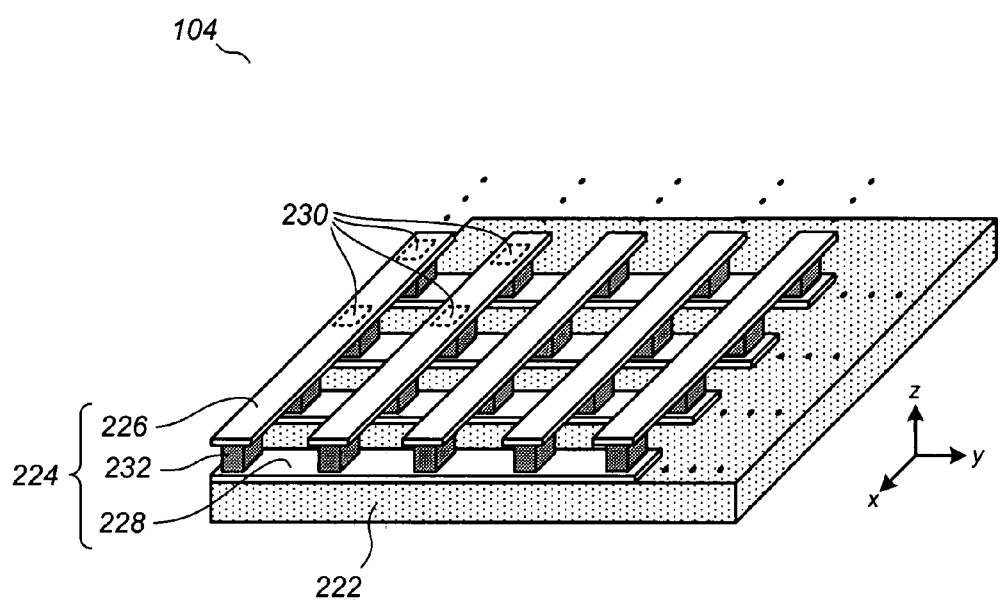
FIG. 2 illustrates a perspective view of a composite material for modulating electromagnetic radiation according to an embodiment.

FIG. 2 illustrates a close-up perspective view of the composite material 104 according to an embodiment. By way of example, and not by way of limitation, an example of a structure suitable for the composite material 104 is described in the context of a particular operating wavelength of 1550 nm. However, it is to be appreciated that the present teachings are applicable across a broad range of electromagnetic radiation frequencies including the visible, infrared, and microwave regions of the spectrum.

Composite material 104 comprises a substrate 222, which is preferably transparent or substantially non-attenuating at the operating wavelength, with one exemplary material being quartz. Formed on the substrate 222 is a cross-point array 224. The cross-point array 224 comprises a plurality of commonly oriented metallic first lines 226 spaced apart by less than the operating wavelength. The cross-point array 224 further comprises a plurality of commonly oriented metallic second lines 228 that are also spaced apart by less than the operating wavelength. In one embodiment, the first lines 226 are spaced apart by less than one-third of the operating wavelength and the second lines 228 are also spaced apart by less than one-third of the operating wavelength. The first lines 226 and second lines 228 each comprise a highly conductive metal such as gold or silver. As illustrated in FIG. 2, the first lines 226 and second lines 228 are positioned in a crossing arrangement with respect to each other, with crosspoint locations 230 being defined where the lines respectively pass near each other.

Composite materials capable of exhibiting negative effective permeability and/or negative effective permittivity with respect to incident electromagnetic radiation are known and continue to be developed and investigated. Such materials, often termed metamaterials, usually comprise periodic arrays of electromagnetically reactive cells that are of substantially small dimension compared to the wavelength of the incident radiation, such as one-third that wavelength or less. A metamaterial can comprise a dielectric patterned with one or more conductors (for example, a dielectric substrate patterned with metallic split-ring resonators), or alternatively can comprise conductors patterned with one or more dielectrics (for example, a so-called "fishnet" structure in which a conductive sheet is patterned with air holes). Although the individual response of any particular electromagnetically reactive cell to an incident wavefront can be quite complicated, the aggregate response across the population of electromagnetically reactive cells can be described macroscopically, as if the composite material were a continuous material, except that the permeability term is replaced by an effective permeability and the permittivity term is replaced by an effective permittivity. Depending on the size, structure, and arrangement of the electromagnetically reactive cells, as well as the frequency at which incident radiation is applied, certain metamaterials can sometimes simultaneously exhibit both a negative effective permeability and a negative effective permittivity, such metamaterials being termed negative index materials.

The overall pattern formed by the crossing of first lines 226 over second lines 228 is designed to be similar to a "fishnet" style metamaterial, except that the first lines 226 and the second lines 228 do not physically touch each other at the crosspoint locations 230. According to an embodiment, composite material 104 comprises an electrically programmable impedance memory element 232 at each of the crosspoint locations 230, the impedance memory element 232 being electrically coupled between the particular one of the first lines 226 and the particular one of the second lines 228 that correspond to that crosspoint location 230. For one embodiment, each impedance memory element 232 comprises a two-terminal, non-volatile resistance memory element that can be set (programmed) to exhibit one of two (or more) distinct resistance values upon application of one or more distinct electrical setting (programming) sequences.

Depending on the particular resistance (or, more generally, impedance) values of the impedance memory elements 232, the crosspoint array 224 can, on a location-by-location basis, achieve the complex resonance condition(s) associated with metamaterial and/or negative index material behavior. In accordance with localized entries into such behavior, localized degrees of such behavior, and localized departures from such behavior, the phase and/or amplitude of the incident radiation IN is modulated. In general, when positive-index behavior (i.e., both effective permittivity and effective permeability are positive) is exhibited at a particular location, the electromagnetic wavefront is generally inhibited from passing through at that location, with any transmitted amounts exhibiting minimal change in the electromagnetic radiation characteristics such as phase or amplitude. In general, when metamaterial and/or negative index material behavior is exhibited, the electromagnetic wavefront can propagate through that location with certain amounts of phase modulation (usually phase advances) and amplitude modulation. For design purposes, the particular amounts of phase and/or amplitude modulation for the particular local geometry and local pattern of impedance memory states are difficult to derive analytically, but can be predicted by computer simulation and refined based on empirical data.

In the embodiment of FIG. 2, the impedance memory elements 232 also serve as sole physical support for the first lines 226 above the second lines 228, with air serving as the separating dielectric. In other embodiments, a non-conducting solid dielectric substantially transparent at the operating wavelength can be used in place of air to facilitate support of the first lines 226 above the second lines 228.

Two-terminal, non-volatile resistance memory elements that can be programmed to exhibit one of two (or more) distinct resistance values upon application of one or more distinct electrical programming sequences are known and continue to be developed and investigated as efforts continue toward denser, faster, and more power-efficient computer memories. Many resistance memory elements are based on the principle that certain dielectrics, which are normally insulating, can be made to conduct through a "filament" or "conduction path" that can form therethrough after the application of a sufficiently high voltage. The conduction path formation can arise from different mechanisms, including defects, metal migration, and other mechanisms. Once the filament is formed, it may be reset (broken), resulting in high resistance, or set (re-formed), resulting in lower resistance, by an appropriately applied voltage.

By way of example and not by way of limitation, materials for the impedance memory elements 232 can include doped chalcogenide glass of the formula $A_XB_Y$, where A includes at least one Group IIIA (B, Al, Ga, In, Ti), Group IVA (C, Si, Ge, Sn, Pb), Group VA (N, P, As, Sb, Bi), or Group VIIA (F, Cl, Br, I, At) element, where B includes at least one of S, Se and Te, and where the dopant is selected from among the noble metals and transition metals, including Ag, Au, Pt, Cu, Cd, Ir, Ru, Co, Cr, Mn or Ni. As another example, materials for the impedance memory elements 232 can include carbon-polymer films comprising carbon black particulates or graphite mixed into a plastic polymer. As another example, materials for the impedance memory elements 232 can include perovskite materials such as $Pr_{1-X}Ca_XMnO_3$ (PCMO), $La_{1-X}Ca_XMnO_3$ (LCMO), $LaSrMnO_3$ (LSMO), or $GdBaCo_XO_Y$ (GBCO).

Advantageously, the high programming speeds and non-volatility of resistance (impedance) memory devices, which make them attractive for computer memory uses, are harnessed by the apparatus 100 in the context of radiation modulation, resulting in plural advantages. For example, because the impedance memory elements 232 can be very quickly programmed and reprogrammed, dynamic spatial modulation (spatiotemporal modulation) can be provided at fast frame rates. As an additional feature, because the impedance memory elements 232 are non-volatile, the composite material 104 can optionally be disconnected from the programming circuit 106 after programming (and/or the programming circuit 106 can go into an "off" or high-impedance state) and the programmed spatial modulation can continue statically even without power to the composite material 104.

As used herein, impedance memory element refers to any type of resistance memory element, and also refers to memory elements in which inductance values and/or capacitance values may be varied, either by themselves or in conjunction with their resistances. The complex resonance behaviors of the modulated "fishnet" are generally affected by several electrical characteristics (inductance, capacitance, and resistance) at the crosspoints 230 between the first lines (row conductors) 226 and the second lines (column conductors) 228. Accordingly, since it is the overall local resonance alterations that are of interest rather than the crosspoint resistances per se, it would be within the scope of the embodiments for the impedance memory elements 232 to "remember" their programming in the form of settable capacitance and/or inductance values as an alternative to, or in addition to, settable resistance values.

Among other advantages, the composite material 104 of FIG. 1 and FIG. 2 embodies a high degree of structural-functional efficiency, because the metallic conductors that make up the "fishnet" and participate in the resonance behavior are also the same metallic conductors used in programming the impedance memory elements 232. For an operating wavelength of 1550 nm, when the ambient dielectric above the substrate 222 is air, one exemplary set of materials and dimensions is for the metallic first lines 226 to comprise silver, to be roughly 100 nm wide, and to have center-to-center spacings of 300 nm, and for the metallic second lines 228 to have similar materials and dimensions. The vertical separation distance between the metallic lines at each crosspoint 230 should be as small as possible while still accommodating the impedance memory element 232, which can often be made as thin as about 100 nm. For an exemplary overall lateral dimension of 3 cm×3 cm, which is set forth here only by way of example and not by limitation, the counts of metallic first lines 226, metallic second lines 228, and impedance memory element 232 are $10^5$, $10^5$, and $10^{10}$, respectively.

Figure 3:
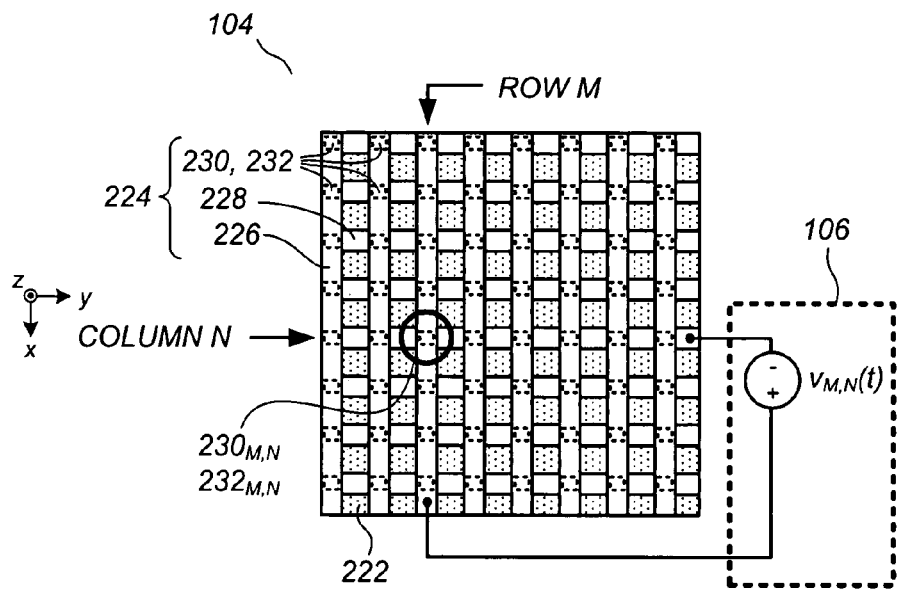
FIG. 3 illustrates a top view of an apparatus for modulating electromagnetic radiation according to an embodiment.

FIG. 3 illustrates a top view of the composite material 104 and a conceptual view of the programming circuit 106 as it relates to an arbitrary impedance memory element $232_{M,N}$ located at cross-point $230_{M,N}$ between an $M^{th}$ first line 226 (row M) and the $N^{th}$ second line 228 (column N). Using a Cartesian convention in which rows extend in the x-direction and columns extend in the y-direction, the first lines 226 can alternatively be referenced as row conductors and the second lines 228 can alternatively be referenced as column conductors. The programming circuit 106 is configured and dimensioned such that a programming voltage $v_{M,N}(t)$ is applied across the impedance memory element $232_{M,N}$ to place it in the desired impedance state. Methods of programming large arrays of impedance/resistance memory elements are known in the art as described, for example, in the commonly assigned US07224598B2. Advantageously, the local resonance characteristics across the surface of the composite material 104 can be influenced on an individual cross-point by cross-point basis, thus providing the ability for very fine spatial resolution of the modulation as may be desirable for human-viewable static spatial modulation results or spatiotemporal modulation results.

Figure 4:
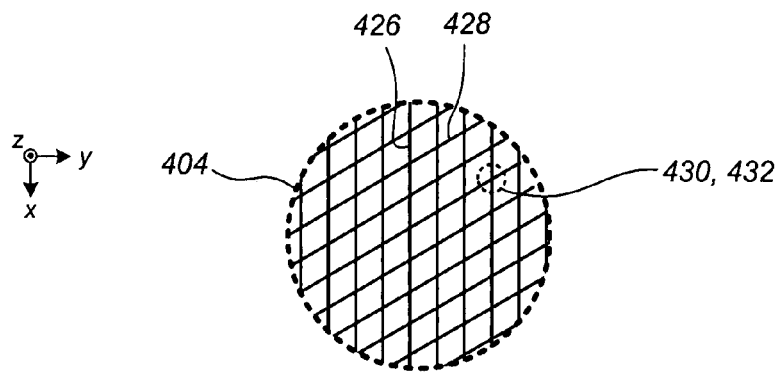
FIGS. 4-6 illustrate top views of composite materials for modulating electromagnetic radiation according to one or more embodiments.

FIG. 4 illustrates a top view of a small portion of a composite material 404 according to an embodiment, comprising first lines 426, second lines 428, cross-point locations 430, and impedance memory elements 432 that are analogous in structure and function to the first lines 226, second lines 228, cross-point locations 230, and impedance memory elements 232 of the composite material 104 of FIGS. 1-3, supra. In the embodiment of FIG. 4, however, the first lines 426 are in a crossing configuration at an angle other than 90 degrees with the second lines 428, which may be desirable for achieving different kinds of "fishnet" structures.

Figure 5:
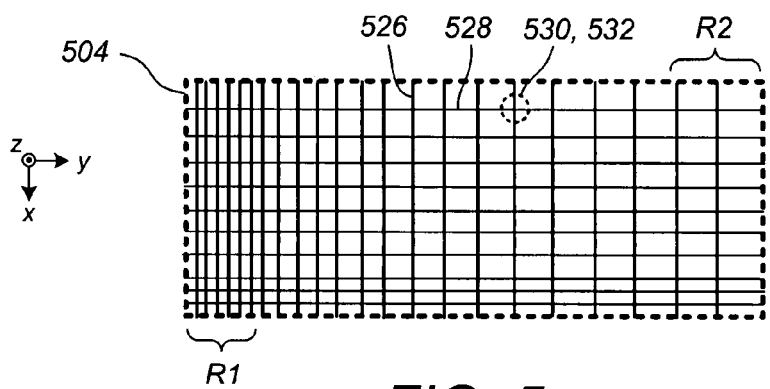

FIG. 5 illustrates a top view of a small portion of a composite material 504 according to an embodiment, comprising first lines 526, second lines 528, cross-point locations 530, and impedance memory elements 532 that are analogous in structure and function to the first lines 226, second lines 228, cross-point locations 230, and impedance memory elements 232 of the composite material 104 of FIGS. 1-3, supra. In the embodiment of FIG. 5, the spacings of the first lines 526 and second lines 528 are spatially varied across the radiation-receiving surface of the composite material 504 for providing varying degrees of negative effective permittivity and/or negative effective permeability thereacross. Many possibilities are presented, such as the ability for a first region R1 to be in a negative-index state and region R2 to be in a positive-index state when all impedances are set low, and then for the region R2 to be changed to a negative index state by switching the impedances at the relative crosspoints therein to a higher state.

Figure 6:
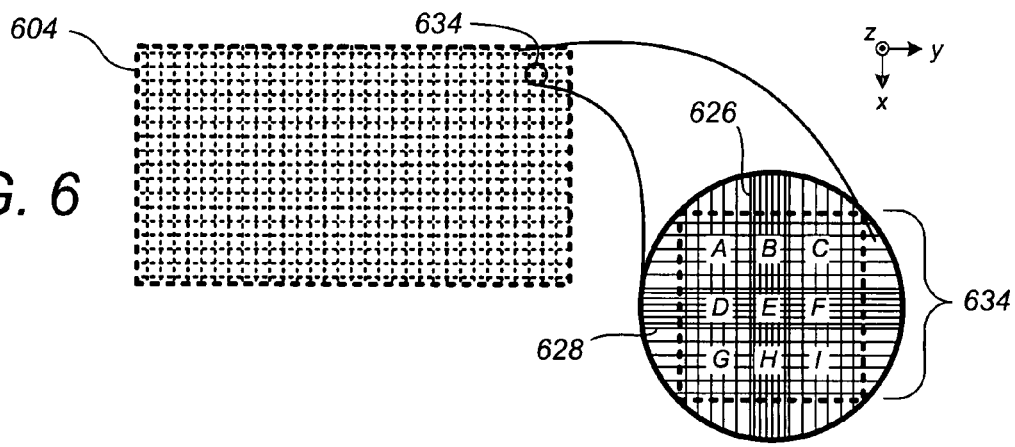

FIG. 6 illustrates a top view of a small portion of a composite material 604 according to an embodiment, comprising first lines 626 and second lines 628 analogous in structure and function to the first lines 226 and second lines 228 of the composite material 104 of FIGS. 1-3, supra, with other elements omitted from FIG. 6 for clarity of presentation. As a device capable of spatial and/or spatiotemporal modulation of electromagnetic wavefronts in phase and/or amplitude, the large population of crossing metallic lines can be notionally grouped into small regions of holographic elements (hogels). Accordingly, composite material 604 can be characterized as defining a population of notional hogels 634 at respective non-overlapping areas thereon. In order to contain a sufficient number of crossing lines to controllably affect a local amplitude and/or phase modulation result, the hogels 634 should usually be considered as being about a square of the operating wavelength or greater in size. Each hogel 634 thus encompasses plural adjacent first lines 626, plural adjacent second lines 628, and plural impedance memory elements. At least one of a phase modulation value and amplitude modulation value associated with each hogel 634 at the operating wavelength is at least partially variable according to the programmed state of at least one of the plural impedance memory elements therein. The hogels 634 can have similar or different properties across the surface of the composite material 604, depending on the desired modulation patterns.

Composite material 604 further defines, within each hogel 634, a plurality of non-overlapping sub-hogels, denoted as A through I in FIG. 6. Each sub-hogel has an area less than the square of the operating wavelength and encompasses at least one first line 626, at least one second line 628, and at least one impedance memory element. The plurality of sub-hogels includes a first sub-hogel or group of sub-hogels (for example, sub-hogels A, C, G, and I) configured and dimensioned to promote variations in the phase modulation value for the overall hogel 634 according to variations in the programmed states of their impedance memory elements. The plurality of sub-hogels further includes a second sub-hogel or group of sub-hogels (for example, sub-hogels B, D, E, F, and H) configured and dimensioned to promote variations in the amplitude modulation value for the overall hogel 634 according to variations in the programmed state of their impedance memory elements. In this manner, independence (i.e., non-linkage) between the amount of phase modulation and amplitude modulation provided by the hogel 634 is promoted, for allowing a greater variety of overall complex modulation values.

For incident radiation beams having multiple different wavelengths, different sub-hogel areas within a particular hogel can be configured to promote different amounts of phase and/or amplitude modulation for different wavelengths. Alternatively or in conjunction therewith, different hogels across the surface of the composite material 604 can be configured to promote different amounts of phase and/or amplitude modulation for different wavelengths.

Figure 7:
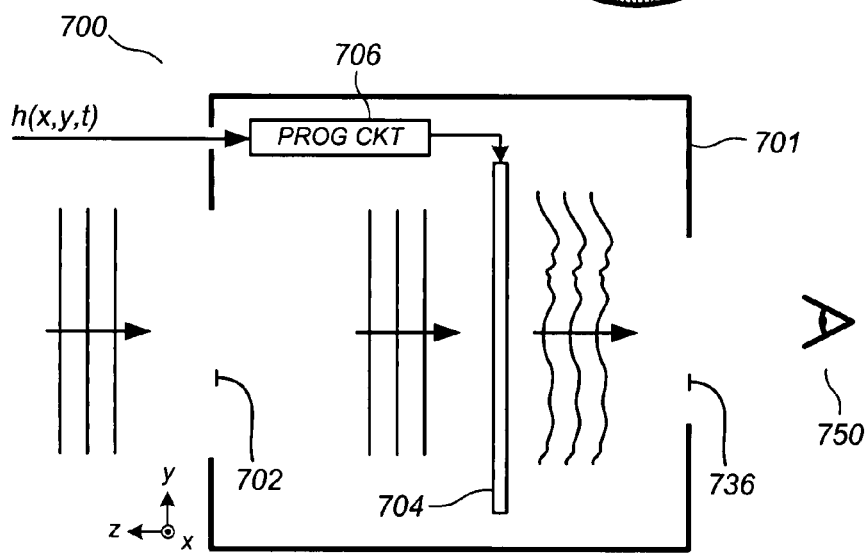
FIGS. 7-8 illustrate side views of devices for modulating electromagnetic radiation according to one or more embodiments.

FIG. 7 illustrates a side view of a device 700 for modulating electromagnetic radiation according to an embodiment. Device 700 comprises, within a housing 701, a source 702 of electromagnetic radiation comprising a two-dimensional aperture that admits an externally provided radiation beam. The externally provided beam can be, for example, an unmodulated coherent plane wave at the operating wavelength. The radiation beam is caused to impinge upon a composite material 704 similar to one or more of the composite materials described supra, which is driven by a programming circuit 706. The programming circuit 706 receives a continuously updated stream h(x,y,t) of a desired set of programmed states. The programmed states can be updated, for example, at intervals of $\frac{1}{24}^{th}$ of a second. Device 700 further comprises a two-dimensional output viewing port 736 to allow viewing of the modulated radiation beam by a viewer 750, the viewer perceiving, for example, a prerecorded holographic movie or live holographic video having a three-dimensional appearance to the extent permitted by a size of the viewing port 736.

Figure 8:
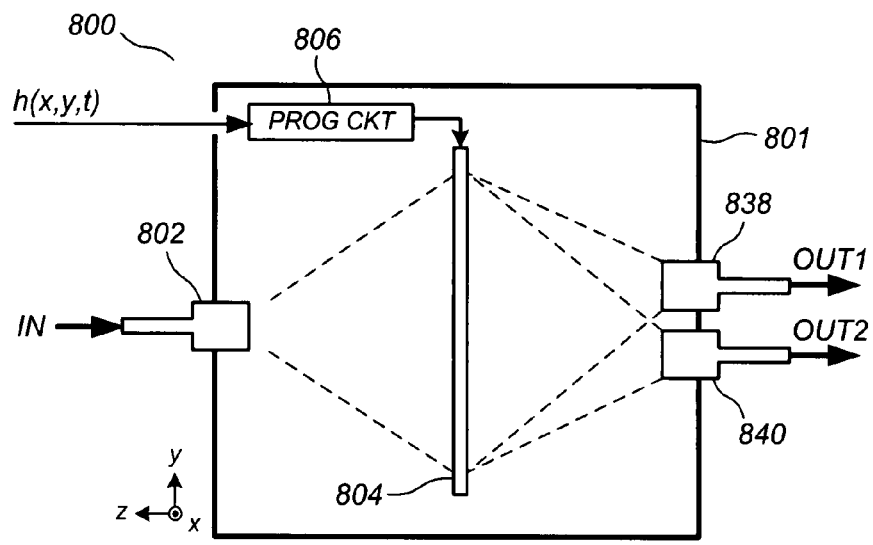

FIG. 8 illustrates a side view of a device 800 for modulating electromagnetic radiation according to an embodiment. Device 800 comprises, within a housing 801, a source 802 of electromagnetic radiation comprising a lensing element that projects an optical signal IN from a waveguide toward a composite material 804 similar to one or more of the composite materials described supra, which is driven by a programming circuit 806. The programming circuit 806 receives a continuously updated stream h(x,y,t) that changes in time between two fixed sets of programmed states. A first of the programmed states causes a first linearly varying phase shift such that the radiation beam is directed to a first output 838, while a second of the programmed states causes a second linearly varying phase shift such that the radiation beam is directed to a second output 840, thereby achieving an A/B switching functionality.

Advantageously, unlike many radiation modulation schemes that are useful only in small slices of the electromagnetic spectrum, the modulating composite material architectures presented hereinabove according to one or more of the embodiments are generally applicable to a variety of different wavelengths by direct physical scaling. Many radiation modulation schemes are highly dependent on the physical characteristics of particular specialized materials and therefore are limited to their spectral ranges of operation (e.g., lithium niobate-based modulators, liquid crystal-based modulators, dichroic filters, etc.). In contrast, with only a few collateral assumptions (e.g., the ability to find a substrate or mechanical support for the crosspoint array that is transparent at the operating wavelength, and the ability to find sufficiently small impedance memory elements to fit at the crosspoints), a composite material according to one or more of the embodiments can be realized for any of visible, infrared, and microwave modulation by selecting suitable values for the metallic conductor sizing, spacing, and configuration.

Moreover, whereas many optical modulation schemes cannot be extended to microwave frequency operation at all, it is arguable that fabrication of a modulating composite material according to one or more of the embodiments gets even easier at microwave wavelengths than for optical/infrared wavelengths, since size restrictions on the impedance memory elements becomes more relaxed at the larger wavelengths. According to an embodiment, where larger impedance memory elements are allowable, they can be realized by less expensive assemblies of discrete off-the-shelf components (e.g., sensors, mechanical relays, etc.) and/or application-specific integrated circuit devices.

Particular materials and dimensions for optical control devices and radiation control devices having the above-described structures and functionalities could be identified for the relevant operating wavelength analytically, empirically, or otherwise by a person skilled in the art using known design techniques in view of the present disclosure. Fabrication of devices according to one or more of the embodiments can be achieved using known integrated circuit fabrication methods including, but not limited to: deposition methods such as chemical vapor deposition (CVD), metal-organic CVD (MOCVD), plasma enhanced CVD (PECVD), chemical solution deposition (CSD), sol-gel based CSD, metal-organic decomposition (MOD), Langmuir-Blodgett (LB) techniques, thermal evaporation/molecular beam epitaxy (MBE), sputtering (DC, magnetron, RF), and pulsed laser deposition (PLD); lithographic methods such as optical lithography, extreme ultraviolet (EUV) lithography, x-ray lithography, electron beam lithography, focused ion beam (FIB) lithography, and nanoimprint lithography; removal methods such as wet etching (isotropic, anisotropic), dry etching, reactive ion etching (RIE), ion beam etching (IBE), reactive IBE (RIBE), chemical-assisted IBE (CAIBE), and chemical-mechanical polishing (CMP); modifying methods such as radiative treatment, thermal annealing, ion beam treatment, and mechanical modification; and assembly methods such as stacking, wafer bonding, surface mount, and other wiring and bonding methods.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, although the impedance memory elements in one or more embodiments supra are non-volatile memory elements not requiring external power to maintain their programmed state, the scope of the present teachings is not so limited. In other embodiments, the impedance memory elements may, if required by their known or hereinafter developed architectures, be volatile and provided with a rail voltage or other form of electrical power as may be necessary to maintain their programmed state.

By way of further example, although the first lines (row conductors) and second lines (column conductors) are illustrated in one or more of the embodiments supra as being contained in different vertical layers of the composite material, in other embodiments they can be maintained primarily in a common plane to even more closely resemble known "fishnet" metamaterials. In these embodiments, overpass-style structures at the crosspoint locations can be provided to maintain electrical separation between the first lines (row conductors) and second lines (column conductors) and accommodate the impedance memory elements therebetween.

By way of even further example, although the impedance memory elements in one or more embodiments supra are two-port memory elements, the scope of the present teachings is not so limited. In other embodiments, the impedance memory elements may be three- or four-port impedance memory elements, wherein the composite material may further include additional layers of metallic lines to provide the required interconnect capability. In these embodiments, the additional layers of metallic lines can be placed parallel to the metallic lines of the first or second layer, such that their basic fishnet pattern is maintained relative to the propagating radiation. Alternatively, the three or four layers of metallic lines can be crossed at different, judiciously selected angles known or hereinafter identified as supporting metamaterial or negative-index behavior for the composite material structure. Thus, reference to the details of the described embodiments is not intended to limit their scope.

What is claimed is:

1. An apparatus, comprising:
    a source of a radiation beam having a wavelength; and
    a composite material, comprising:
        a plurality of commonly oriented metallic first lines spaced apart by less than said wavelength;
        a plurality of commonly oriented metallic second lines spaced apart by less than said wavelength and positioned in a crossing arrangement with said first lines, a crosspoint location being defined where each said first line crosses each said second line, the crosspoint location having a dimension that is less than said wavelength; and
        an electrically programmable impedance memory element at each said crosspoint location electrically coupled between the first and second lines corresponding thereto, each impedance memory element having an electrically programmed state;
    wherein said composite material modulates said radiation beam according to said electrically programmed states of said impedance memory elements.

2. The apparatus of claim 1, wherein each of said impedance memory elements is selected from the group consisting of: doped chalcogenide glass-based resistive memory elements; carbon-polymer film-based resistive memory elements; and perovskite-based memory elements.

3. The apparatus of claim 1, further comprising:
    a memory unit external to said composite material for storing a desired predetermined pattern of states for said impedance memory elements; and
    an electrical write circuit coupled to said first lines, said second lines, and said memory unit and configured to transfer said predetermined pattern of states to said impedance memory elements.

4. The apparatus of claim 3, wherein said composite material further comprises a substantially planar substrate providing mechanical support for said first lines, said second lines, and said impedance memory elements, wherein said substrate is at least partially transparent at said wavelength, wherein said first lines and said second lines cross at about 90 degrees in said crossing arrangement, and wherein said composite material modulates said radiation beam as it propagates therethrough.

5. The apparatus of claim 4, wherein each of said impedance memory elements is non-volatile, and wherein said electrical write circuit is configured to enter into a high-impedance disconnect state relative to each of said impedance memory elements subsequent to transferring said predetermined pattern.

6. The apparatus of claim 1, wherein said first lines have a first average spacing of less than one-third said wavelength, wherein said second lines have a second average spacing of less than one-third said wavelength, and wherein said first lines, said second lines, and said impedance memory elements are configured and dimensioned such that said composite material exhibits at least one of a negative effective permittivity and a negative effective permeability at said wavelength for at least one set of programmed states of said impedance memory elements.

7. The apparatus of claim 6, said wavelength being a first wavelength, said radiation beam further having at least one additional wavelength different than said first wavelength, said crossing arrangement of said first lines and said second lines defining a radiation-receiving surface of said composite material, wherein said first line spacings and said second line spacings are spatially varied across said radiation-receiving surface for providing at least one of spatially dependent variation and wavelength dependent variation of said negative effective permittivity and/or negative effective permeability across said radiation-receiving surface.

8. The apparatus of claim 6, said composite material defining a population of notional holographic elements (hogels) at respective non-overlapping areas thereon, each hogel having an area greater than a square of said wavelength, each hogel encompassing plural adjacent first lines, plural adjacent second lines, and plural impedance memory elements, wherein at least one of a phase modulation value and amplitude modulation value associated with each hogel at said wavelength is at least partially variable according to the programmed state of at least one of said plural impedance memory elements therein.

9. The apparatus of claim 8, wherein at least two of said hogels are different with respect to at least one of first line average spacing, second line average spacing, and impedance memory element structure.

10. The apparatus of claim 8, said composite material further defining, within each hogel, a plurality of non-overlapping sub-hogels, each sub-hogel having an area less than the square of said wavelength and encompassing at least one first line, at least one second line, and at least one impedance memory element, wherein said plurality of sub-hogels includes a first sub-hogel configured and dimensioned to promote variations in said phase modulation value for said hogel according to variations in the programmed state of at least one of the impedance memory elements in said first sub-hogel, and wherein said plurality of sub-hogels includes a second sub-hogel configured and dimensioned to promote variations in said amplitude modulation value for said hogel according to variations in the programmed state of at least one of the impedance memory elements in said second sub-hogel.

11. The apparatus of claim 1, wherein said wavelength is an optical wavelength, and wherein the apparatus further comprises a two-dimensional output viewing port for viewing of the modulated radiation beam by a viewer.

12. The apparatus of claim 1, wherein said wavelength is one of an optical wavelength and a microwave wavelength, wherein said apparatus further comprises an output port, and wherein said composite material and said output port are configured and mutually positioned such that (i) for a first programmed state of said impedance memory elements, said composite material directs said radiation beam toward said output port, and (ii) for a second programmed state of said impedance memory elements, said composite material does not direct said radiation beam toward said output port, whereby said apparatus is operable as an electrically controlled optical switch.

13. A method for modulating a radiation beam, comprising:

causing the radiation beam to impinge upon a composite material, wherein said composite material comprises:

a plurality of commonly oriented metallic first lines having a first average spacing less than a wavelength of the radiation beam;

a plurality of commonly oriented metallic second lines having a second average spacing less than said wavelength and positioned in a crossing arrangement with said first lines, a crosspoint location being defined where each said first line crosses each said second line, the crosspoint location having a dimension that is less than said wavelength; and an electrically programmable impedance memory element at each said crosspoint location electrically coupled between the first and second lines corresponding thereto; and programming each of said impedance memory elements by applying an electrical programming signal across the first line and second line corresponding to that impedance memory element, thereby placing that impedance memory element in a programmed state;

wherein said radiation beam is modulated by said composite material according to said programmed states of said impedance memory elements.

14. The method of claim 13, wherein each of said impedance memory elements is selected from the group consisting of: doped chalcogenide glass-based resistive memory elements; carbon-polymer film-based resistive memory elements; and perovskite-based memory elements.

15. The method of claim 13, said crossing arrangement of said first lines and said second lines defining a radiation-receiving surface of said composite material, said first lines having a first average spacing of less than one-third said wavelength, said second lines having a second average spacing of less than one-third said wavelength, and wherein said programming further comprises:

setting a first subset of said impedance memory elements associated with a first lateral region of said radiation-receiving surface to a first programmed state that causes said composite material to exhibit at least one of a negative effective permittivity and a negative effective permeability at said wavelength across said first lateral region; and setting a second subset of said impedance memory elements associated with a second lateral region of said radiation-receiving surface to a second programmed state that causes said composite material to exhibit positive effective permittivity and positive effective permeability at said wavelength across said second lateral region.

16. The method of claim 13, wherein said programming comprises placing each said impedance memory element into a predetermined time sequence of programmed states according to a predetermined time signal stored in a memory device external to said composite material.

17. The method of claim 13, each of said impedance memory elements being a non-volatile resistive memory element, and the method further comprising placing the first and second lines associated with each said resistive memory element into electrically disconnected states subsequent to said programming, said composite material subsequently spatially modulating said radiation beam statically according to said programmed states without requiring external electrical power.

18. An apparatus, comprising:

a source of a radiation beam having a wavelength;

a substrate that is substantially non-attenuating at said wavelength;

a cross-point array formed on said substrate, said cross-point array comprising a layer of substantially parallel metallic row conductors disposed in a crossing pattern with a layer of substantially parallel metallic column conductors, said cross-point array further comprising an electrically programmable impedance memory element at each cross-point between said row and column conductors, each cross-point having a dimension that is less than said wavelength, wherein said row conductors and said column conductors each have average spacings less than said wavelength; and an electrical programming circuit coupled to said cross-point array for transferring a desired pattern of programmed states to said impedance memory elements;

wherein the radiation beam is modulated according to electrically programmed states of the impedance memory elements while propagating through said cross-point array.

19. The apparatus of claim 18, wherein each of said impedance memory elements is a two-port, non-volatile memory element selected from the group consisting of: doped chalcogenide glass-based resistive memory elements; carbon-polymer film-based resistive memory elements; and perovskite-based memory elements.

20. The apparatus of claim 19, wherein said wavelength is one of an optical wavelength and a microwave wavelength, and wherein said cross-point array is configured and dimensioned to exhibit at least one of a negative effective permittivity and a negative effective permeability at said wavelength for at least one set of programmed states of said impedance memory elements.

* * * * *